United States Patent [19]

Fukuda et al.

[11] Patent Number: 5,465,063
[45] Date of Patent: Nov. 7, 1995

[54] PULSE GENERATING CIRCUIT WITH TEMPERATURE COMPENSATION

[75] Inventors: Tatsuya Fukuda; Shigeru Mori; Masanori Hayashikoshi; Seiji Sawada, all of Hyogo, Japan

[73] Assignee: Mitsubishi Denki Kabushiki Kaisha, Tokyo, Japan

[21] Appl. No.: 49,398

[22] Filed: Apr. 21, 1993

[30] Foreign Application Priority Data

Aug. 7, 1992 [JP] Japan ............................ 4-211678

[51] Int. Cl.⁶ .......................................... H03L 1/02
[52] U.S. Cl. .................... 327/512; 327/513; 327/172; 331/176
[58] Field of Search ...................... 307/310, 491, 307/260; 331/57, 65, 66, 176, 186; 327/129, 138, 164, 165, 172, 178, 549, 512, 513, 175

[56] References Cited

U.S. PATENT DOCUMENTS

| 4,804,929 | 2/1989 | Kato et al. ............... 331/52 |
| 4,910,421 | 3/1990 | Brahmbhatt et al. ........ 331/52 |
| 5,072,192 | 12/1991 | Anderson .................. 331/52 |
| 5,180,995 | 1/1993 | Hayashi et al. ........... 331/52 |

FOREIGN PATENT DOCUMENTS

| 3149287A1 | 6/1983 | Germany . |
| 3401610A1 | 7/1985 | Germany . |
| 63-152094 | 6/1988 | Japan . |
| 3-195058 | 8/1991 | Japan . |

Primary Examiner—Timothy P. Callahan
Assistant Examiner—Dinh T. Le
Attorney, Agent, or Firm—Lowe, Price, LeBlanc & Becker

[57] ABSTRACT

A pulse signal generating circuit includes a ring oscillator and an internal voltage generating circuit. The internal voltage generating circuit generates an internal voltage depending on an operation temperature. The internal voltage is low at a normal temperature, and is high at a high temperature. Each inverter in the ring oscillator is driven by the internal voltage supplied from the internal voltage generating circuit. Thereby, a period of a pulse signal increases at a normal temperature, and decreases at a high temperature.

10 Claims, 11 Drawing Sheets

5,465,063

PULSE GENERATING CIRCUIT WITH TEMPERATURE COMPENSATION

BACKGROUND OF THE INVENTION

1. Field of the Invention

The present invention relates to a pulse signal generating circuit and a semiconductor memory device, and in particular, relates to a pulse signal generating circuit for controlling a refresh operation.

1. Description of the Background Art

FIG. 9 is a block diagram showing a general structure of a dynamic random access memory (will be referred to as "DRAM"). The DRAM is formed on a semiconductor chip CH.

A memory cell array 1 includes a plurality of word lines, a plurality of bit lines crossing the plurality of word lines and a plurality of memory cells arranged at crossings thereof. Each memory cell includes a capacitor for storing data and an N-channel transistor. The N-channel transistor is connected between the capacitor and the bit line, and has a gate connected to the word line.

An RAS buffer 2 receives an external row address strobe signal/RAS, and generates an internal row address strobe signal/RASI. A CAS buffer 3 receives an external column address strobe signal CAS, and generates an internal column address strobe signal/CASI. A WE buffer 4 receives an external write enable signal/W, and generates an internal write enable signal/WI.

In a normal operation, a row address buffer 5 receives an external address signal ADD through a switch 17, and generates a row address signal in response to the internal row address strobe signal/RASI. A row decoder 6 is responsive to the row address signal to select one of the plurality of word lines in the memory cell array 1. A word driver 7 drives the word line selected by the row decoder 6 to a predetermined voltage. Thereby, data is read from the plurality of memory cells connected to the selected word line onto the corresponding bit line pairs. The data read onto each bit line pair is amplified by a sense amplifier 8.

A column address buffer 9 receives an external address signal ADD, and generates a column address signal in response to the internal column address strobe signal/CASI. A column decoder 10 is responsive to the column address signal to select one of the plurality of bit line pairs. Thereby, the selected bit line pair is connected to an input/output line pair.

In a write operation, externally applied input data D is sent to the input/output line pair through an I/O circuit 11. In a read operation, data on the input/output line pair is supplied outside the chip as output data D through the I/O circuit 11.

A control circuit 12 is responsive to the internal row address strobe signal/RASI, internal column address strobe signal/CASI and internal write enable signal/WI to generate various control signals for controlling various parts.

A self-refresh changing circuit 13, an internal address generating circuit 14, a pulse signal generating circuit 15 and a timer 16 form a refresh control circuit.

When a refresh enable signal REFE supplied from the timer 16 attains an active state (e.g., high level), a refresh operation is carried out. In the refresh operation, the row decoder 6 is responsive to the row address signal to select one of the plurality of word lines in the memory cell array 1. The word driver 7 drives the word line selected by the row decoder 6 to a predetermined voltage. Thereby, data is read from the plurality of memory cells connected to the selected word line onto the corresponding bit line pairs. The data read onto each bit line pair is amplified by the sense amplifier 8.

Thereafter, the voltage of the word line is restored to the ground voltage. Thereby, the data on the plurality of bit line pairs amplified by the sense amplifier 8 is written into the plurality of memory cells connected to the selected word line, respectively. In this manner, the data in the plurality of memory cells connected to the selected word line is refreshed.

Now, a self-refresh operation of the DRAM in FIG. 9 will be described below with reference to a timing chart of FIG. 10.

The self-refresh changing circuit 13 receives a clock signal $\phi_E$ from the control circuit 12. The self-refresh changing circuit 13 applies a self-refresh control signal SREF to the internal address generating circuit 14, the pulse signal generating circuit 15, the timer 16 and the switch 17.

In FIG. 10, when the external row address strobe signal/RAS falls to the low level at time t1 after the external column address strobe signal/CAS fell to the low level (i.e., in a CAS before RAS cycle), the refresh enable signal REFE supplied from the timer 16 rises to the high level. Thereby, the above refresh operation is carried out.

The self-refresh changing circuit 13 counts pulses in the clock signal $\phi_E$, and changes the self-refresh control signal SREF into the active state (i.e., high level) at time t2 after the elapsing of a predetermined time period from the time t1. This activates the internal address generating circuit 14 and pulse signal generating circuit 15, so that the self-refresh operation starts.

The internal address generating circuit 14 sequentially generates the refresh address signals indicative of the refresh address. The pulse signal generating circuit 15 generates a pulse signal $\phi$ of a constant period. The timer 16 counts pulses in the pulse signal $\phi$.

When the timer 16 counts a predetermined number of pulses, it raises the refresh enable signal REFE to the high level, and thereafter, lowers the refresh enable signal REFE to the low level when it counts a predetermined number of pulses. In this manner, the timer 16 is responsive to the pulse signal $\phi$ to repetitively and alternately change the refresh enable signal REFE to the high and low levels at a constant period T3.

The RAS buffer 2 is responsive to the refresh enable signal REFE to alternately change the internal row address strobe signal/RASI to the high and low levels.

The row address buffer 5 is responsive to the fall of the internal row address strobe signals/RASI to sequentially apply the refresh address signals, which are received from the internal address generating circuit 14, to the row decoder 6. The row decoder 6 is responsive to the refresh address signals to sequentially select the word lines in the memory cell array 1. Thereby, the data in the memory cells connected to the selected word line are refreshed.

The above operation is repeated until the external row address strobe signal/RAS rises to the high level.

In FIG. 10, the refresh operation is carried out during a period T1 from the time t1 to the time t2, and the self-refresh operation is carried out during the period T2 from the time t2 to the time t3.

As described above, the refresh period T3 in the self-refresh operation depends on the counting number of pulses of the pulse signal $\phi$ by the timer 16.

FIG. 11 shows a structure of the pulse signal generating circuit 15. The pulse signal generating circuit 15 includes a plurality of inverters G1 which are mutually connected in a ring form. The plurality of inverters G1 form a ring oscillator. The pulse signal φ is sent from a node n1 between two of the inverters G1 of this ring oscillator.

FIG. 12 is a circuit diagram showing the inverter. The inverter G1 includes a P-channel MOS transistor P1 and an N-channel MOS transistor N1. The transistor P1 is connected between a node n2 and a node n5, and has a gate connected to a node n4. The transistor N1 is connected between the node n5 and a node n3, and has a gate connected to the node n4. The node n2 is connected to a power supply terminal which receives a supply voltage Vcc. The node n3 is connected to a ground terminal which receives a ground voltage (0 V).

If the inverter G1 is to be activated and inactivated in response to the self-refresh control signal SREF, a transistor is connected between the power supply terminal and the node n2 or between the ground terminal and the node n3. This transistor has a gate receiving the self-refresh control signal SREF.

As described above, in the DRAM, the refresh period T3 in the self-refresh operation depends on the counting number of pulses of the pulse signal φ generated from the pulse signal generating circuit 15. If the operation temperature of the DRAM is high, a data holding time of a memory cell is short. Therefore, the refresh period T3 must be short at a high temperature.

In the conventional DRAM, the counting number of pulses of the pulse signals φ by the timer 16 is set at a relatively small value in view of the worst condition at a high temperature. Thus, the refresh operation is carried out at a short period regardless of the high and normal temperatures.

Consequently, the refresh operation is carried out at a short period, which has an excessively large margin with respect to leak of data, at the normal temperature. This results in extra power consumption at the normal temperature.

SUMMARY OF THE INVENTION

An object of the invention is to provide a pulse signal generating circuit to reduce power consumption.

Another object of the invention is to provide a pulse signal generating circuit of which power consumption in a refresh operation is reduced.

Still another object of the invention is to provide a semiconductor memory device of which power consumption in a refresh operation is reduced.

A pulse signal generating circuit according to one aspect of the invention includes an internal voltage generating circuit and a signal generating circuit. The internal voltage generating circuit generates an internal voltage depending on an operation temperature. The signal generating circuit is driven by the internal voltage, which is generated by the internal voltage generating circuit, to generate a pulse signal.

In this pulse signal generating circuit, the drive voltage of the signal generating circuit changes depending on an operation temperature. Thereby, the period of the pulse signal generated by the signal generating circuit changes depending on the operation temperature.

A pulse signal generating circuit according to another aspect of the invention includes a signal generating circuit and a resistance element. The signal generating circuit includes a plurality of inverters which are mutually connected in a ring form, and generates a pulse signal. The resistance element is connected between two of the plurality of inverters, and has a negative temperature characteristic.

In this pulse signal generating circuit, a resistance value of the resistance element is small at a high operation temperature, and the resistance value of the resistance element is large at a low operation temperature. Thereby, the period of the pulse signal generated by the signal generating circuit is short at the high operation temperature, and the period of pulse signal generated by the signal generating circuit is long at the low operation temperature.

A pulse signal generating circuit according to still another aspect of the invention includes a node for receiving a supply voltage, a signal generating circuit, a resistance element and a control circuit. The signal generating circuit is driven by the supply voltage, which is supplied through the node, to generate a pulse signal. The resistance element is connected between the node and the signal generating circuit. The control circuit controls a resistance value of the resistance element depending on an operation temperature.

In this pulse signal generating circuit, the resistance value of the resistance element is controlled depending on the operation temperature, and thereby, the current supplied to the signal generating circuit is controlled. Therefore, the period of the pulse signal generated by the signal generating circuit changes depending on the operation temperature.

A pulse signal generating circuit according to yet another aspect of the invention includes a signal generating circuit, a temperature detecting circuit and a control circuit. The signal generating circuit generates a pulse signal. The temperature detecting circuit detects an operation temperature to supply a detection signal. The control circuit is responsive to the detection signal supplied from the temperature detecting circuit to control the period of the pulse signal generated by the signal generating circuit.

In this pulse signal generating circuit, the operation temperature is detected, and the period of the pulse signal generated by the signal generating circuit is controlled in response to the detection signal.

As described above, the pulse signal generating circuit can generate the pulse signal of which period changes depending on the operation temperature. Therefore, the refresh operation can be controlled utilizing the pulse signal generating circuit, whereby the power consumption in the refresh operation can be reduced, while always keeping a time margin required for leak of data.

A semiconductor memory device of further another aspect of the invention includes a dynamic memory circuit for storing data, a pulse signal generating circuit for generating a pulse signal and a refresh control circuit for controlling a refresh operation of the dynamic memory circuit in response to the pulse signal generated by the pulse signal generating circuit.

The pulse signal generating circuit includes an internal voltage generating circuit and a signal generating circuit. The internal voltage generating circuit generates an internal voltage depending on an operation temperature. The signal generating circuit is driven by the internal voltage generated by the internal voltage generating circuit to generate the pulse signal.

In this semiconductor memory device, the period of the pulse signal generated by the pulse signal generating circuit changes depending on the operation temperature. Therefore, the period of the refresh operation changes depending on the operation temperature.

A semiconductor memory device of still further another aspect of the invention includes a dynamic memory circuit for storing data, a pulse signal generating circuit for generating a pulse signal and a refresh control circuit for controlling a refresh operation of the dynamic memory circuit in response to the pulse signal generated by the pulse signal generating circuit.

The pulse signal generating circuit includes a signal generating circuit and a resistance element. The signal generating circuit includes a plurality of inverters mutually connected in a ring form, and generates a pulse signal. The resistance element is connected between two of the plurality of inverters, and has a negative temperature characteristic.

In this semiconductor memory device, the period of the pulse signal generated by the pulse signal generating circuit is short at a high operation temperature, and the period of the pulse signal generated by the pulse signal generating circuit is long at a low operation temperature. Therefore, the period of a refresh operation is short at the high temperature, and the period of the refresh operation is long at the low operation temperature.

A semiconductor memory device of yet further another aspect of the invention includes a dynamic memory circuit for storing data, a pulse signal generating circuit for generating a pulse signal and a refresh control circuit for controlling a refresh operation of the dynamic memory circuit in response to the pulse signal generated by the pulse signal generating circuit.

The pulse signal generating circuit includes a node for receiving a supply voltage, a signal generating circuit, a resistance element and a resistance control circuit. The signal generating circuit is driven by the supply voltage supplied through the node to generate a pulse signal. The resistance element is connected between the node and the signal generating circuit. The resistance control circuit controls a resistance value of the resistance element depending on an operation temperature.

In this semiconductor memory device, the period of the pulse signal generated by the pulse signal generating circuit changes depending on the operation temperature. Therefore, the period of the refresh operation changes depending on the operation temperature.

A semiconductor memory device of further another aspect of the invention includes a dynamic memory circuit for storing data, a pulse signal generating circuit for generating a pulse signal and a refresh control circuit for controlling a refresh operation of the dynamic memory circuit in response to the pulse signal generated by the pulse signal generating circuit.

The pulse signal generating circuit includes a signal generating circuit, a temperature detecting circuit and a period control circuit. The signal generating circuit generates a pulse signal. The temperature detecting circuit detects an operation temperature to supply a detection signal therefrom. The period control circuit controls the period of the pulse signal generated by the signal generating circuit depending on the detection signal supplied from the temperature detecting circuit.

In this semiconductor memory device, the period of the pulse signal generated by the pulse signal generating circuit is controlled based on the detected operation temperature. Therefore, the period of the refresh operation is controlled based on the detected operation temperature.

As described above, the semiconductor memory device can carry out the refresh operation, of which period can changed depending on the operation temperature. Therefore, the power consumption in the refresh operation can be reduced, while always keeping a time margin required for leak of data.

The foregoing and other objects, features, aspects and advantages of the present invention will become more apparent from the following detailed description of the present invention when taken in conjunction with the accompanying drawings.

DESCRIPTION OF THE PREFERRED EMBODIMENT (1) First Embodiment

Figure 1A:
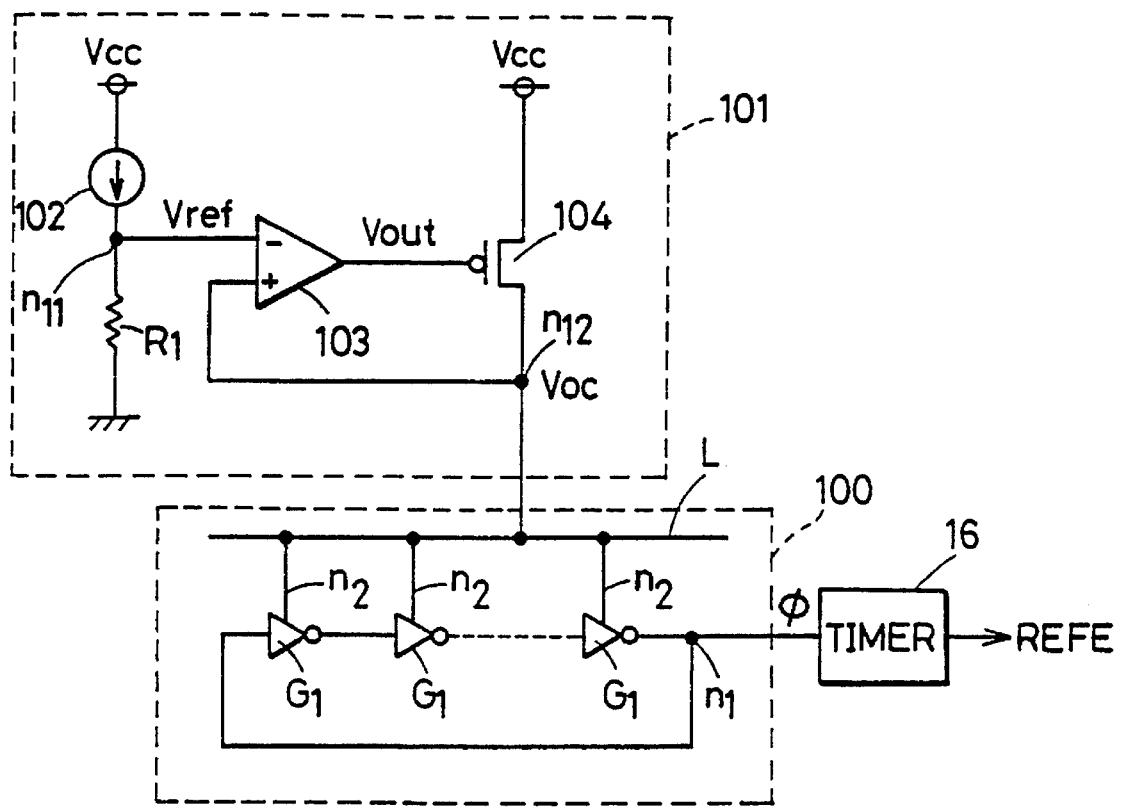
FIG. 1 is a circuit diagram showing a pulse signal generating circuit used in a DRAM of a first embodiment.
Figure 1B:
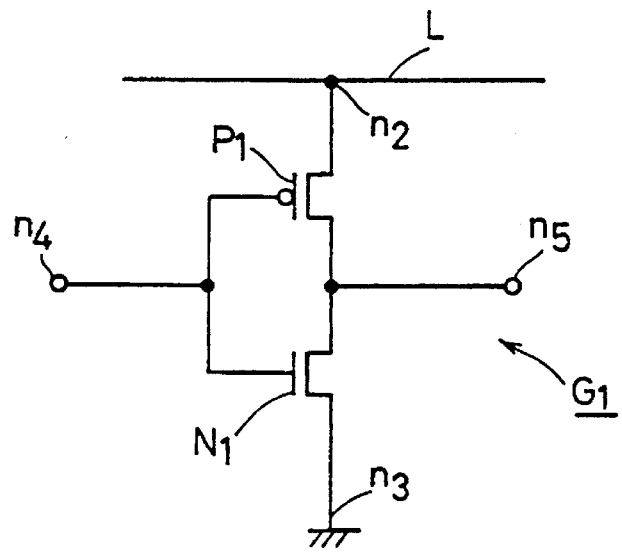

FIG. 1(a) is a circuit diagram showing a pulse signal generating circuit used in a DRAM of a first embodiment, and FIG. 1(b) is a circuit diagram of an inverter. A whole structure of the DRAM of the first embodiment is similar to that shown in FIG. 9.

The pulse signal generating circuit shown in FIG. 1(a) includes a ring oscillator 100 and an internal voltage generating circuit 101. The ring oscillator 100 includes a plurality of inverters G1 which are mutually connected in a ring form.

Each inverter G1 includes a P-channel MOS transistor P1 and an N-channel MOS transistor N1, as shown in FIG. 1(b). The transistor P1 is connected between nodes n2 and n5, and has a gate connected to a node n4. The transistor N1 is connected between the nodes n5 and n3, and has a gate connected to the node n4. The node n2 is connected to an internal power supply line L. The node n3 is connected to a ground terminal.

Figure 9:
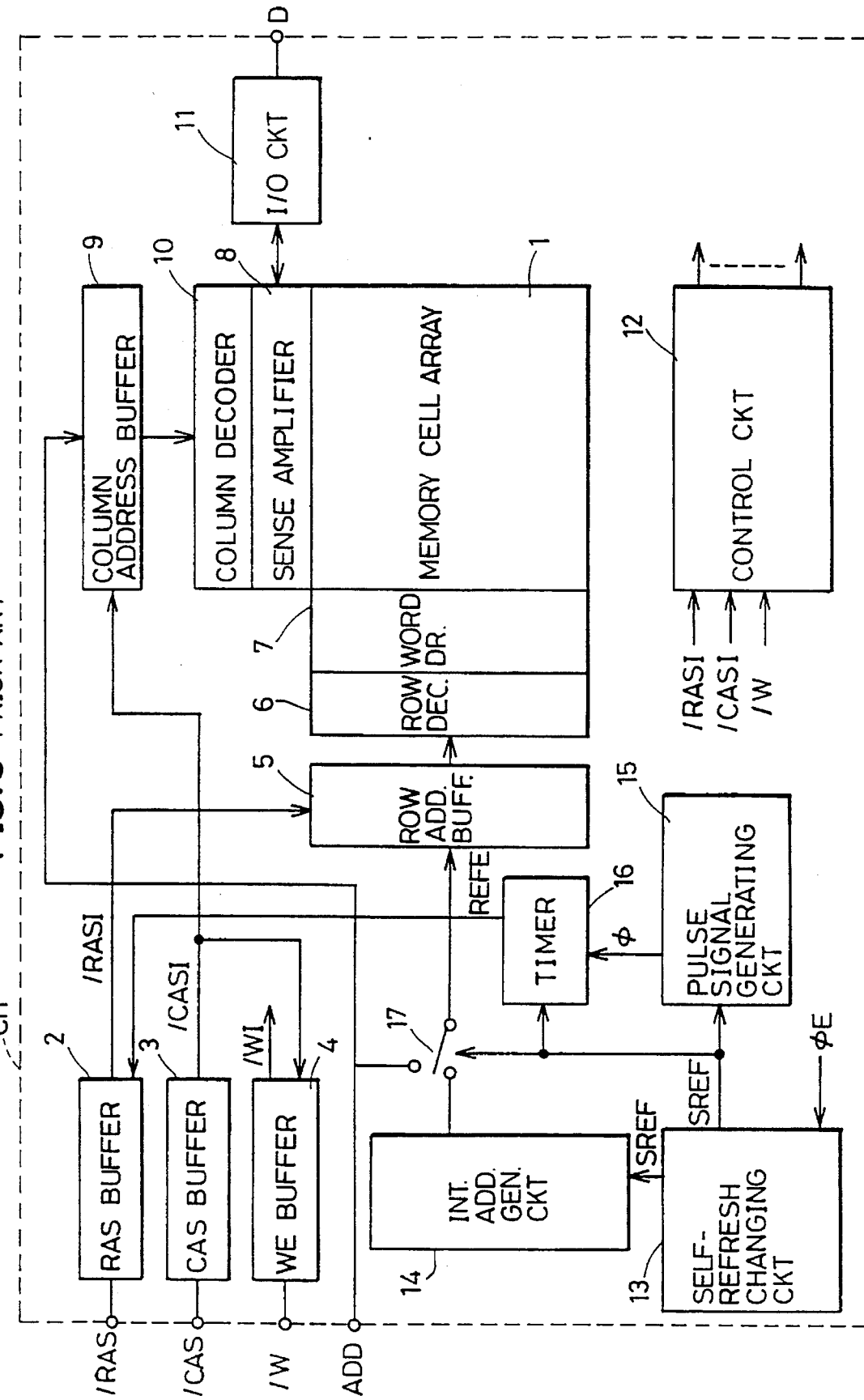
FIG. 9 is a block diagram showing a whole structure of a conventional DRAM.

In practice, a transistor is connected between the internal power supply line L and the node n3, or between the node n2 and the ground terminal in order to activate or inactivate the pulse signal generating circuit 100 in response to a self-refresh control signal SREF (see FIG. 9).

The internal voltage generating circuit 101 includes a constant current source 102, a differential amplifier 103, a P-channel MOS transistor 104 and a resistor R1. The constant current source 102 is connected between the power supply terminal receiving the supply voltage Vcc and a node n11. The resistor R1 is connected between the node n11 and the ground terminal. The resistor R1 is formed, e.g., from polycide, and has a positive temperature characteristic. A reference voltage Vref is obtained at the node n11.

The differential amplifier 103 has a negative input terminal connected to the node n11 and a positive input terminal connected to the node n12. The transistor 104 is connected between the power supply terminal and the node n12. The transistor 104 receives at its gate an output voltage Vout from the differential amplifier 103. The node n12 is connected to the internal power supply line L, and receives an internal voltage Voc.

Now, an operation of the pulse signal generating circuit in FIG. 1 will be described below.

Assuming that the reference voltage Vref at the node n11 is always constant, the output voltage Vout of the differential amplifier 103 depends on the internal voltage Voc of the node n12. When the internal voltage Voc exceeds the reference voltage Vref, the voltage Vout rises. Thereby, the transistor 104 attains a weak on-state and acts to lower the internal voltage Voc.

Meanwhile, when the internal voltage Voc lowers below the reference voltage Vref, the output voltage Vout lowers. Thereby, the transistor 104 attains a strong on-state and acts to raise the internal voltage Voc. Owing to a series of the operations described above, the internal voltage Voc is controlled to approach the reference voltage Vref, and is always maintained at a constant level.

In the above description, it is assumed that the reference voltage Vref is always constant. However, by using the resistor R1 having a positive temperature characteristic, as shown in FIG. 1, the reference voltage Vref also has a dependency on the temperature. In this case, however, there is not change in the relationship between the reference voltage Vref, internal voltage Voc and output voltage Vout.

When the operation temperature (circumferential temperature) rises, the resistance of the resistor R1 also increases. This increase in resistance of resistor R1 increases the reference voltage Vref, so that the internal voltage Voc increases toward the reference voltage Vref.

Meanwhile, when the operation temperature lowers, the resistance of the resistor R1 also decreases. Therefore, the reference voltage Vref lowers, so that the internal voltage Voc lowers toward the reference voltage Vref.

As described above, when the operation temperature rises, the internal voltage Voc increases. When the operation temperature is lowered, the internal voltage Voc decreases.

Since the node n12 of the internal voltage generating circuit 101 is connected to the internal supply line L, each inverter G1 in the ring oscillator 100 is driven by the internal voltage Voc. Therefore, the transmission speed of each inverter G1 depends on the internal voltage Voc.

Thus, when the operation temperature rises, the signal transmission speed of each inverter G1 increases. Consequently, the period of the pulse signal φ generated from the ring oscillator 100 decreases. Meanwhile, when the operation temperature lowers, the signal transmission speed of each inverter G1 decreases. Consequently, the period of the pulse signal φ generated from the ring oscillator 100 increases.

Figure 10:
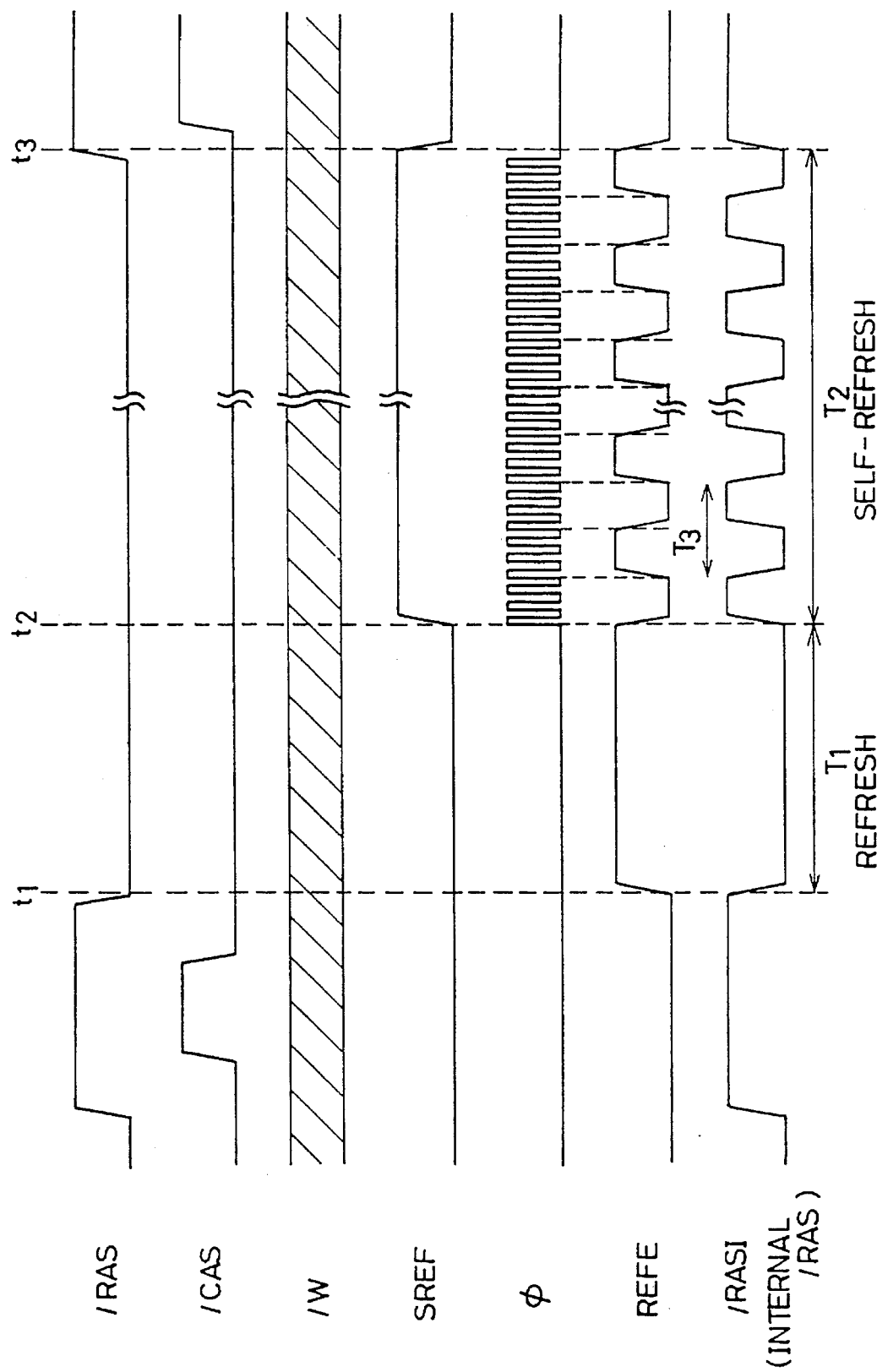
FIG. 10 is a timing chart for showing a self-refresh operation in the DRAM in FIG. 9.
Figure 11:
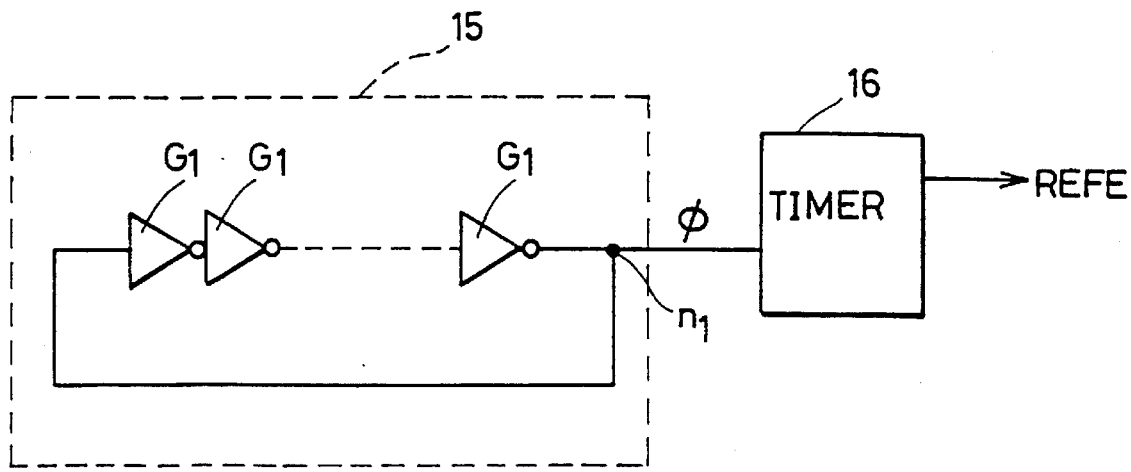
FIG. 11 shows a structure of a pulse signal generating circuit in the prior art.

Therefore, the period of the refresh enable signal REFE generated from the timer 16 becomes short at a high temperature, and become long at a normal temperature. Thus, the refresh period T3 (see FIG. 10) in the self-refresh operation becomes short at the high temperature, and becomes long at the normal temperature.

According to the first embodiment, the refresh operation is reliably executed even at the high temperature, and the power consumption at the normal temperature is reduced.

(2) Second Embodiment

Figure 2:
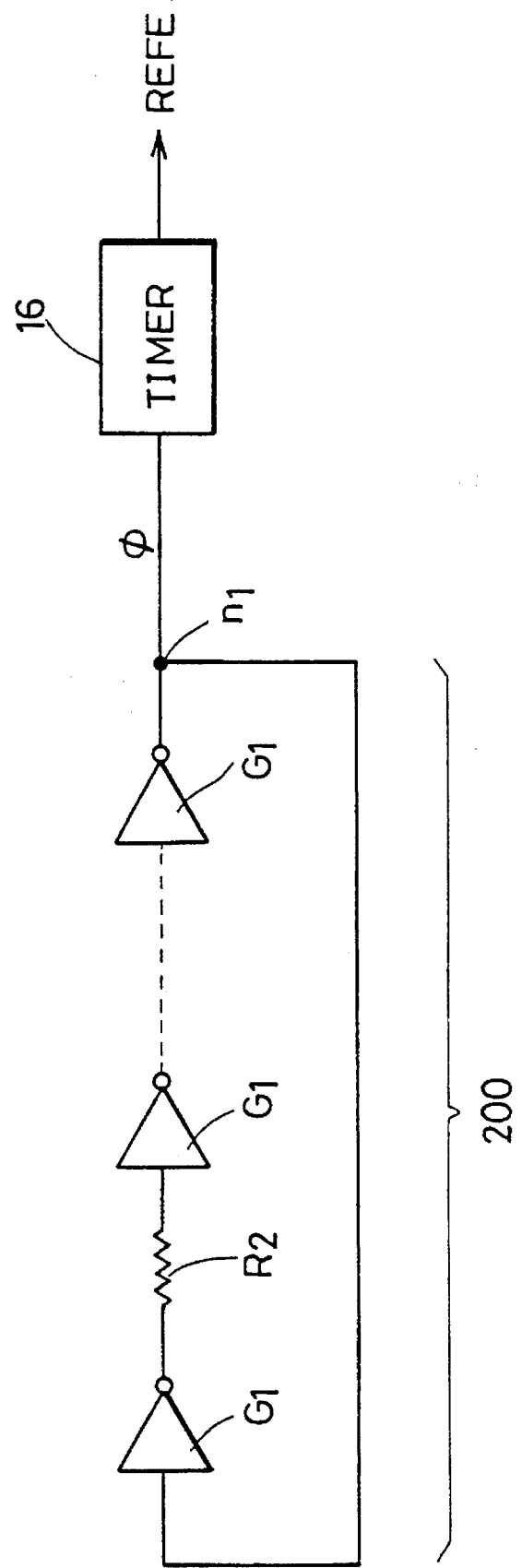
FIG. 2 is a circuit diagram showing a pulse signal generating circuit used in a DRAM of a second embodiment.

FIG. 2 is a circuit diagram showing a pulse signal generating circuit used in a DRAM of a second embodiment. The whole structure of the DRAM of the second embodiment is similar to that shown in FIG. 9.

The pulse signal generating circuit in FIG. 2 includes a ring oscillator 200. The ring oscillator 200 includes a plurality of inverters G1 and a resistor R2 which are mutually connected in a ring form. The resistor R2 is connected between two adjacent inverters G1. The resistor R2 is formed, e.g., of an $n^+$-diffusion layer, and has a negative temperature characteristic.

Now, an operation of the pulse signal generating circuit in FIG. 2 will be described below.

When the operation temperature rises, the resistance of the resistor R2 decreases. Thereby, the signal transmission speed between the inverters G1 in the ring oscillator 200 increases, and the period of the pulse signal φ generated from the node n1 decreases. Meanwhile, when the operation temperature lowers, the resistance of the resistor R2 increases. Thereby, the signal transmission speed between the inverters G1 in the ring oscillator 200 decreases, and the period of the pulse signal φ generated from the node n1 increases. Therefore, the refresh period T3 in the refresh operation becomes short at the high temperature, and becomes long at the normal temperature.

According to the second embodiment, the refresh operation is reliably executed even at the high temperature, and the power consumption at the normal temperature is reduced.

(3) Third Embodiment

Figure 3:
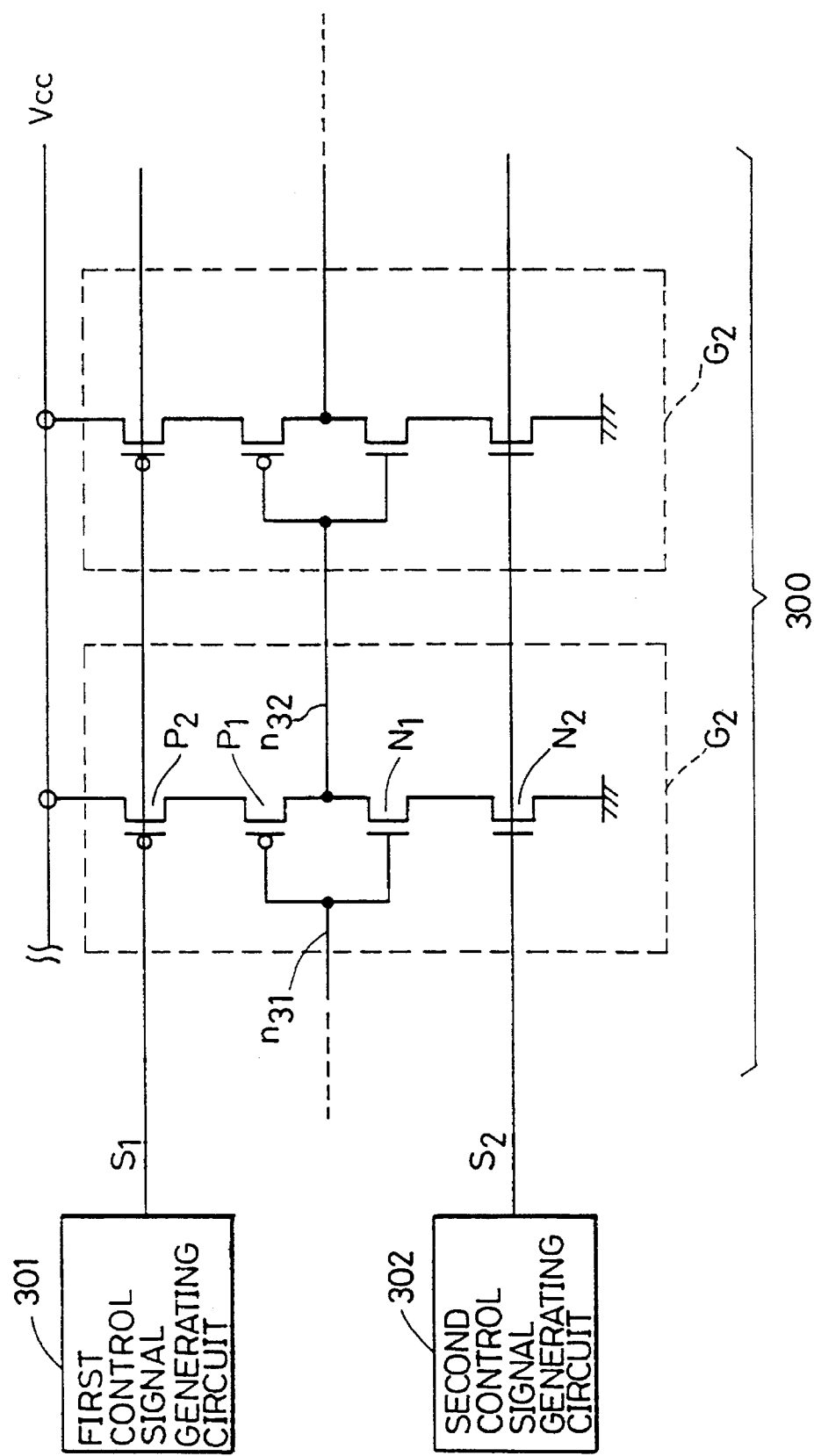
FIG. 3 is a circuit diagram showing a pulse signal generating circuit used in a DRAM of a third embodiment.

FIG. 3 is a circuit diagram showing a pulse signal generating circuit used in a DRAM of a third embodiment. The whole structure of the DRAM of the third embodiment is similar to that shown in FIG. 9.

The pulse signal generating circuit in FIG. 3 includes a ring oscillator 300, a first control signal generating circuit 301 and a second control signal generating circuit 302.

The ring oscillator 300 includes a plurality of inverters G2 mutually connected in a ring form. Each inverter G2 includes P-channel MOS transistors P1 and P2 as well as N-channel MOS transistors N1 and N2.

The transistor P2 and P1 are connected in series between the power supply terminal receiving the supply voltage Vcc and a node n32. The transistors N1 and N2 are connected in series between the node n32 and the ground terminal. Gates of the transistors P1 and N1 are connected to a node n31. The node n31 of each inverter is connected to the node n32 of the preceding inverter. The node n32 of each inverter is connected to the node n31 of the succeeding inverter.

The transistor P2 receives at its gate a control signal S1 having a negative temperature characteristic from the first control signal generating circuit 301. The transistor N2 receives at its gate a control signal S2 having a positive temperature characteristic from the second control signal generating circuit 302. Each of the first and second control signal generating circuits 301 and 302 has the same structure as the internal voltage generating circuit 101 in FIG. 1, except for the followings. The resistor R1 used in the first pulse signal generating circuit 301 has a negative temperature characteristic. Meanwhile, the resistor R1 in the second pulse signal generating circuit 302 has a positive temperature characteristic.

Now, an operation of the pulse signal generating circuit in FIG. 3 will be described below.

When the operation temperature rises, the voltage of the control signal S1 lowers, and the voltage of the control signal $2 rises. Thereby, the transistors P2 and N2 in each inverter G2 attain a strong on-state. This increases the signal transmission speed of each inverter G1, and decreases the period of the pulse signal φ (not shown).

Meanwhile, when the operation temperature is lowered, the voltage of the control signal S1 rises, and the voltage of the control signal S2 is lowered. Thereby, the transistors P2 and N2 in each inverter G attain a weak on-state. This reduces the signal transmission speed of each inverter G2, and increases the period of the pulse signal φ.

According to the third embodiment, the refresh operation is reliably executed even at the high temperature, and the power consumption at the normal temperature is reduced.

(4) Fourth Embodiment

Figure 4:
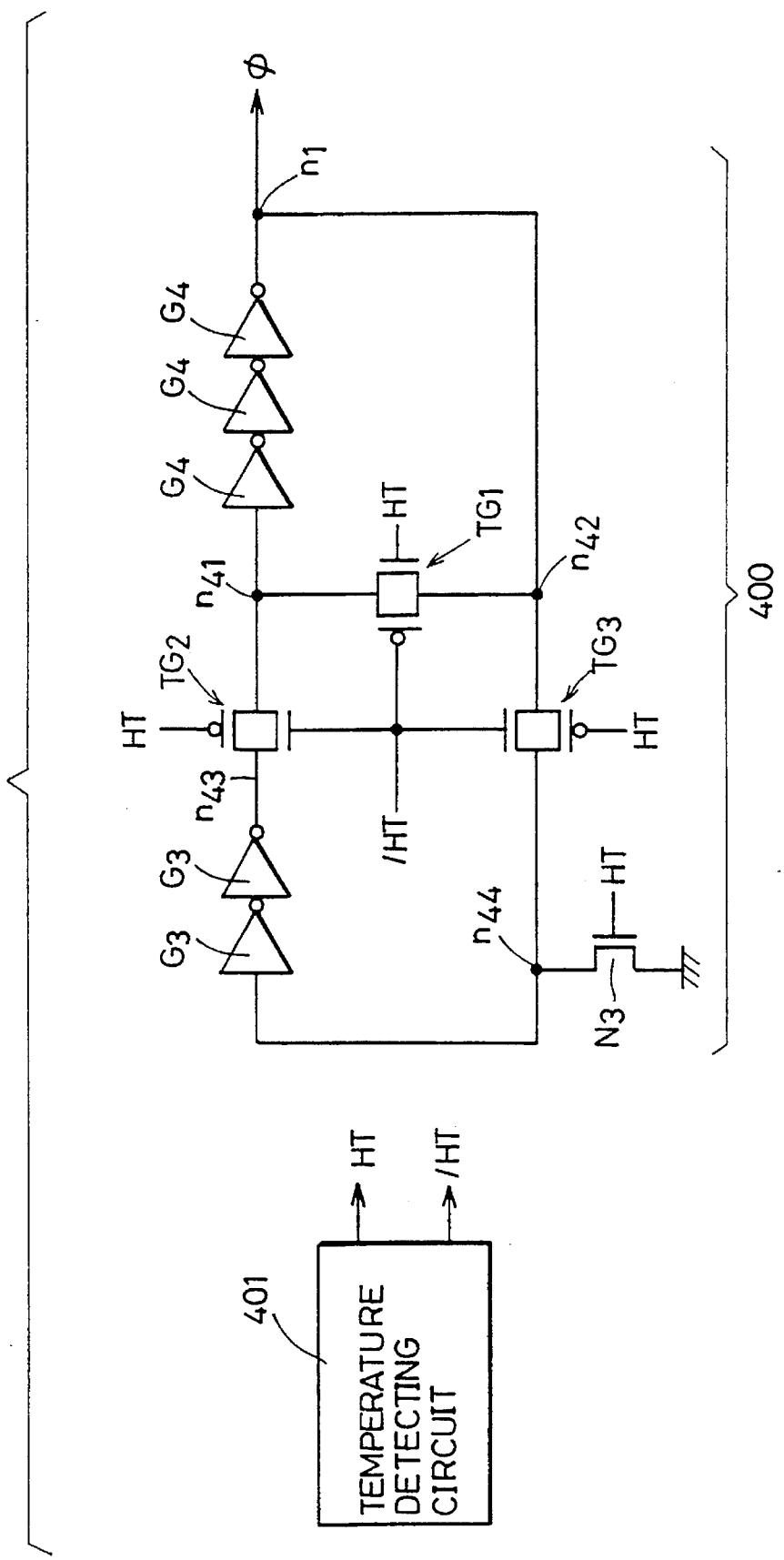
FIG. 4 is a circuit diagram showing a pulse signal generating circuit used in a DRAM of a fourth embodiment.

FIG. 4 is a circuit diagram showing a pulse signal generating circuit used in a DRAM of a fourth embodiment. The whole structure of the DRAM of the fourth embodiment is similar to that shown in FIG. 9.

The pulse signal generating circuit in FIG. 4 includes a ring oscillator 400 and a temperature detecting circuit 401.

The ring oscillator 400 includes a plurality of first inverters G3, a plurality of second inverters G4, transfer gates TG1, TG2 and TG3, and an N-channel MOS transistor N3.

Figure 12:
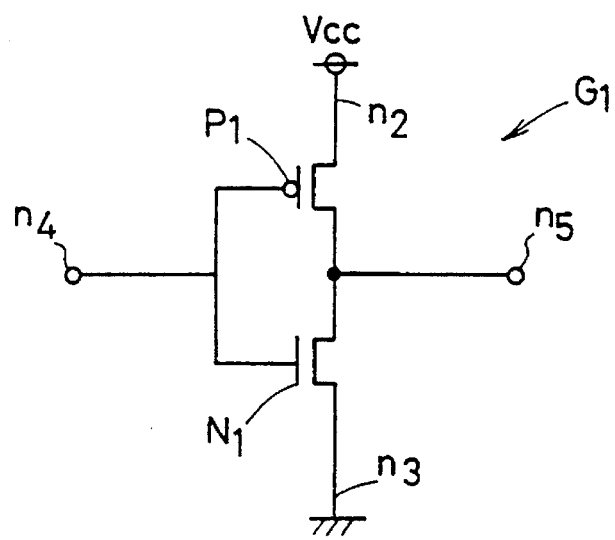
FIG. 12 is a circuit diagram showing an inverter.

The second inverters G4 are connected in series between nodes n41 and n1. The transfer gate TG1 is connected between nodes n41 and n42. The first inverter G3 is connected in series between the nodes n44 and n43. The transfer gate TG2 is connected between nodes n43 and n41. The transfer gate TG3 is connected between nodes n42 and n44. The node n44 is grounded through the transistor N3. Each structure of the inverters G3 and G4 is similar to that shown in FIG. 12.

The temperature detecting circuit 401 detects the operation temperature to generate a detection signal HT and an inverted signal/HT thereof. The temperature detecting circuit 401 set the detection signal HT at a low level when the operation temperature is lower than a predetermined temperature, and sets the detection signal HT at a high level when the operation temperature is higher than a predetermined temperature. The transfer gates TG1, TG2 and TG3 are controlled by the detection signal HT and the inverted signal/HT generated from the temperature detecting circuit 401. The transistor N3 is controlled by the detection signal HT.

Now, an operation of the pulse signal generating circuit shown in FIG. 4 will be described below.

At the normal temperature, the detection signal HT attains the low level, and the inverted signal/HT attains the high level. Thereby, the transfer gates TG2 and TG3 are turned on, and the transfer gate TG1 is turned off. Also, the transistor N3 is turned off. Thereby, all the inverters G3 and G4 are operatively connected together in the ring form. In this case, the period of the pulse signal φ supplied from the node n1 increases.

At the high temperature, the detection signal HT attains the high level, and the inverted signal/HT attains the low level. Thereby, the transfer gate TG1 is turned on, and the transfer gates TG2 and TG3 are turned off. Also, the transistor N3 is turned on. Thereby, the inverters G4 are operatively connected together in the ring form. In this case, the period of the pulse signal φ supplied from the node n1 decreases.

Therefore, the refresh period T3 in the refresh operation increases at the normal temperature, and the refresh period T3 in the refresh operation decreases at the high temperature.

According to the fourth embodiment, the refresh operation is reliably executed even at the high temperature, and the power consumption can be reduced at the normal temperature.

(5) Fifth Embodiment

Figure 5:
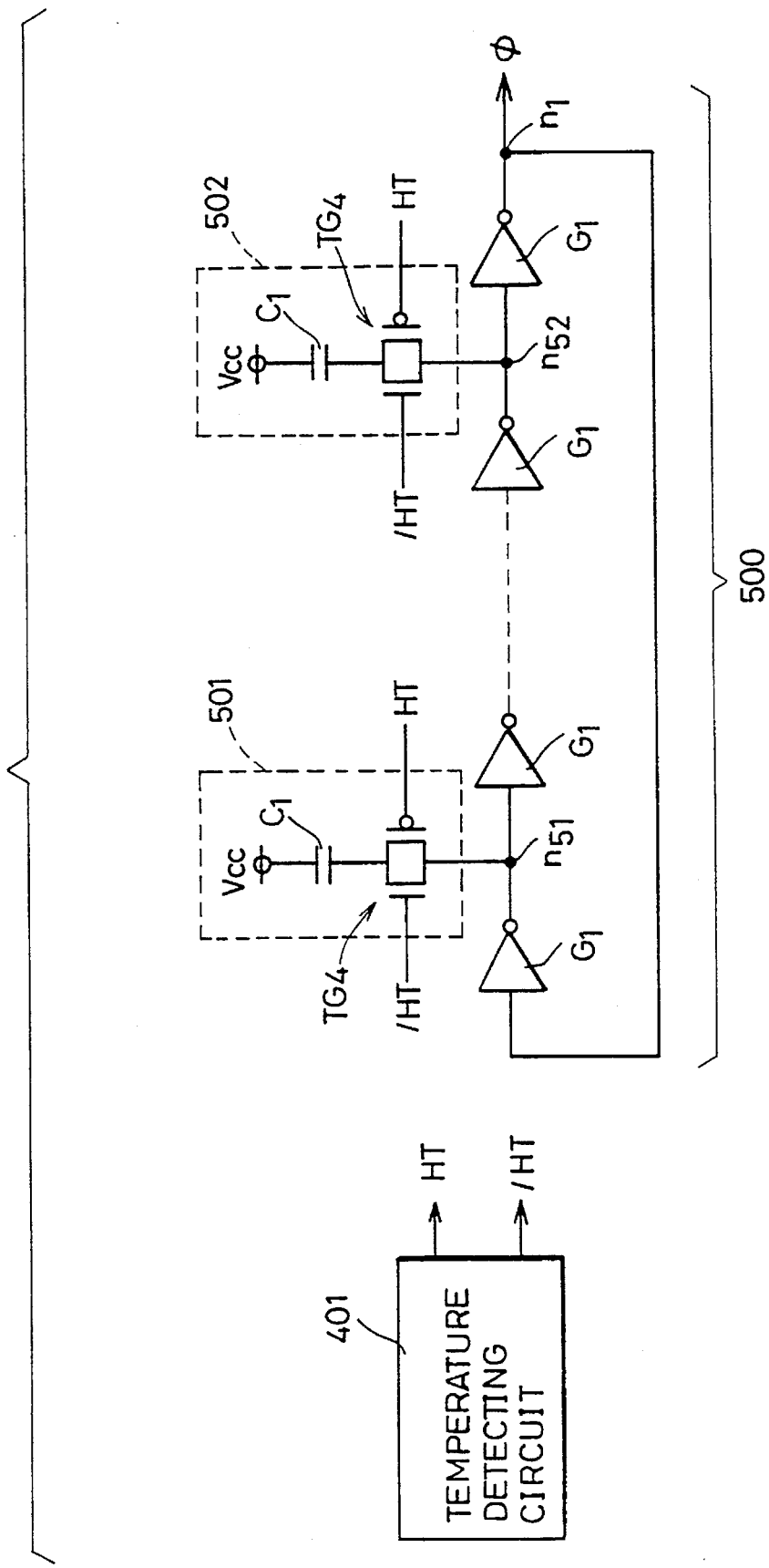
FIG. 5 is a circuit diagram showing a pulse signal generating circuit used in a DRAM of a fifth embodiment.

FIG. 5 is a circuit diagram showing a pulse signal generating circuit used in a DRAM of a fifth embodiment. The whole structure of the fifth embodiment is similar to that shown in FIG. 9.

A pulse signal generating circuit in FIG. 5 includes a ring oscillator 500 and a temperature detecting circuit 401. The ring oscillator 500 includes a plurality of inverters G1 which are connected together in a ring form and capacitance circuits 501 and 502.

Each of the capacitance circuits 501 and 502 includes a capacitor C1 and a transfer gate TG4. The capacitor C1 is connected at its one terminal to the power supply terminal receiving the supply voltage Vcc, and is connected at the other terminal to the transfer gate TG4. The capacitor circuit 501 is connected to a node n51 located between the inverters G1. The capacitance circuit 502 is connected to a node n52 located between the inverters G1.

The temperature detecting circuit 401 operates similarly to the temperature detecting circuit 401 shown in FIG. 4. The transfer gates TG4 in the capacitance circuits 501 and 502 are controlled by the detection signal HT and its inverted signal/HT.

Now, an operation of the pulse signal generating circuit in FIG. 5 will be described below.

At the normal temperature, the detection signal HT attains the low level, and the inverted signal/HT attains the high level. Thereby, the transfer gates TG4 in the capacitance circuits 501 and 502 are turned on, and the capacitors C1 are connected to the nodes n51 and n52, respectively. Consequently, the signal transmission speed of each inverter G1 in the ring oscillator 500 decreases, and the period of the pulse signal φ supplied from the node n1 increases.

At the high temperature, the detection signal HT attains the high level, and the inverted signal/HT attains the low level. Thereby, the transfer gates TG4 in the capacitance circuits 501 and 502 are turned off, and the capacitors C1 are isolated from the nodes n51 and n52, respectively. Consequently, the signal transmission speed of each inverter G1 in the ring oscillator 500 increases, and the period of the pulse signal φ supplied from the node n1 decreases.

Therefore, the refresh period T3 in the refresh operation increases at the normal temperature, and the period T3 in the refresh operation decreases at the high temperature.

According to the fifth embodiment, the refresh operation is reliably executed even at the high temperature, and the power consumption at the normal temperature is reduced.

(6) Sixth Embodiment

Figure 6:
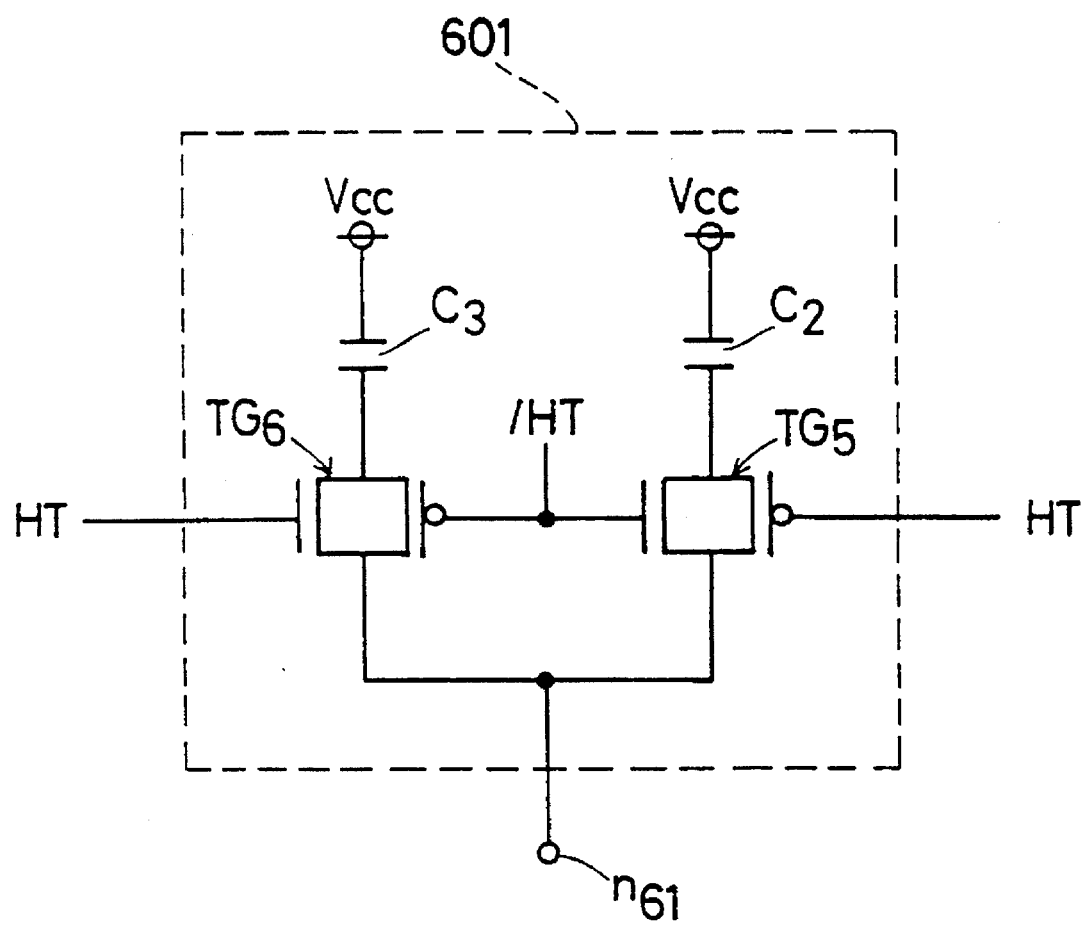
FIG. 6 is a circuit diagram fragmentarily showing a pulse signal generating circuit used in a DRAM of a sixth embodiment.

FIG. 6 is a circuit diagram fragmentarily showing a pulse signal generating circuit used in a DRAM of a sixth embodiment. The whole structure of the DRAM of the sixth embodiment is similar to that shown in FIG. 9.

The pulse signal generating circuit of the sixth embodiment is provided with a ring oscillator similar to the ring oscillator 500 shown in FIG. 5 as well as a capacitance circuit 601 connected thereto instead of the capacitance circuits 501 and 502. The other structures are similar to those shown in FIG. 5.

The capacitance circuit 601 shown in FIG. 6 includes a capacitor C2 having a large capacitance, a capacitor C3 having a small capacitance, and transfer gates TG5 and TG6. The capacitor C2 is connected at its one terminal to the power supply terminal receiving the supply voltage Vcc, and is connected at the other terminal to a node n61 located between the inverters G1 (see FIG. 5) through the transfer gate TG5. The capacitor C3 is connected at its one terminal to the power supply terminal, and is connected at the other terminal to the node n61 through the transfer gate TG6. The transfer gates TG5 and TG6 are controlled by the detection signal HT and the inverted signal/HT generated from the temperature detecting circuit 401 (see FIG. 5).

Now, an operation of the pulse signal generating circuit including the capacitance circuit 601 shown in FIG. 6 will be described below.

At the normal temperature, the detection signal HT attains the low level, and the inverted signal/HT attains the high level. Thereby, the transfer gate TG5 in the capacitance circuit 601 is turned on, and the transfer gate TG6 is turned off. Therefore, the capacitor C2 having a large capacitance is connected to the node n61, and the capacitor C3 having a small capacitance is isolated from the node n61. Consequently, the signal transmission speed in the ring oscillator decreases, and the period of the pulse signal φ increases.

At the high temperature, the detection signal HT attains the high level, and the inverted signal/HT attains the low level. Thereby, the transfer gate TG5 in the capacitance circuit 601 is turned off, and the transfer gate TG6 is turned on. Therefore, the capacitor C2 having the large capacitance is isolated from the node n61, and the capacitor C3 having the small capacitance is connected to the node n61. Consequently, the signal speed in the ring oscillator increases, and the period of the pulse signal φ decreases.

Therefore, the refresh period T3 in the refresh operation becomes long at the normal temperature, and the refresh period T3 in the refresh operation becomes short at the high temperature.

According to the sixth embodiment, the refresh operation can be executed even at the high temperature, and the power consumption can be reduced at the normal temperature.

(7) Seventh Embodiment

Figure 7:
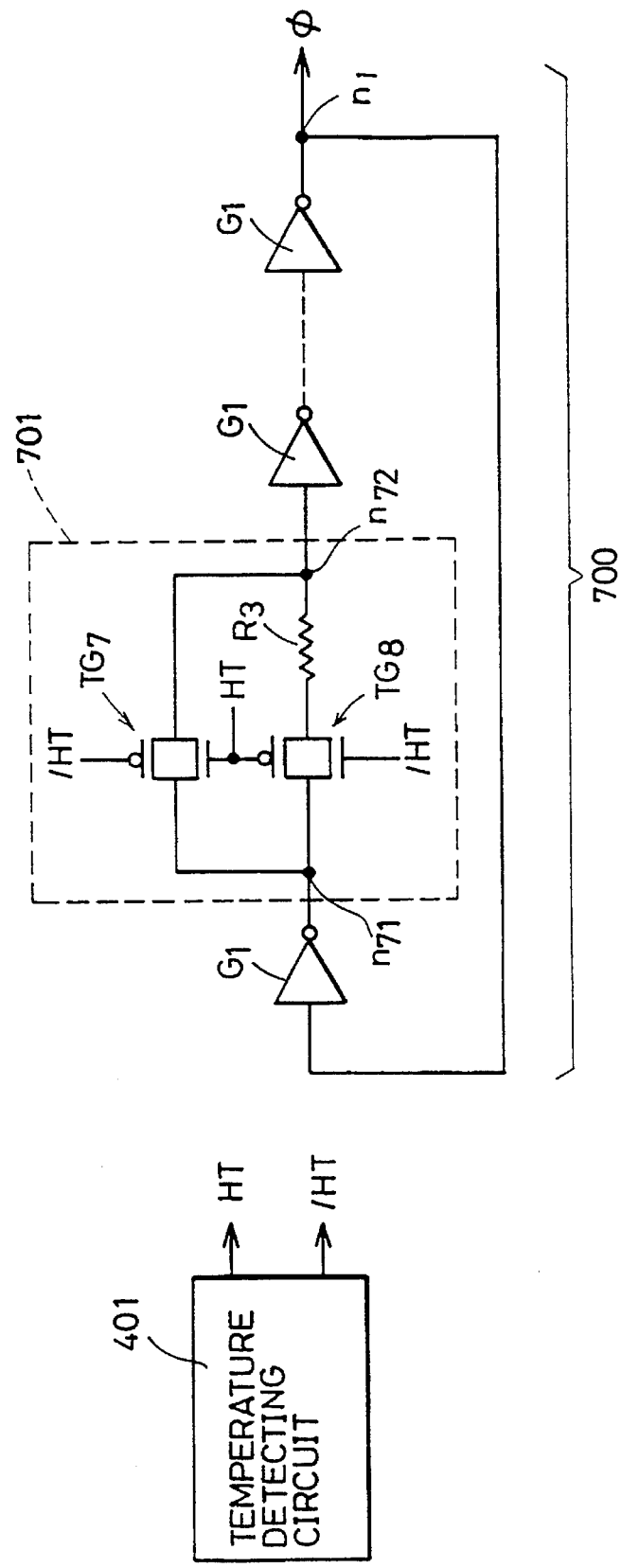
FIG. 7 is a circuit diagram showing a pulse signal generating circuit used in a DRAM of a seventh embodiment.

FIG. 7 is a circuit diagram showing a pulse signal generating circuit used in a DRAM of a seventh embodiment. The whole structure of the DRAM of the seventh embodiment is similar to that shown in FIG. 9.

The pulse signal generating circuit in FIG. 7 includes a ring oscillator 700 and a temperature detecting circuit 401.

The ring oscillator 700 includes a plurality of inverters G1, which are mutually connected in a ring form, and a resistor circuit 701. The resistor circuit 701 is connected between two inverters G1. The resistor circuit 701 includes a resistor R3 and transfer gates TG7 and TG8. The transfer gate TG7 is connected between nodes n71 and n72. A serial circuit formed of the transfer gate TG8 and resistor R3 is connected between the nodes n71 and n72 in parallel to the transfer gate TG7.

An operation of the temperature detecting circuit 401 is similar to that of the temperature detecting circuit 401 shown in FIG. 4. The transfer gates TG7 and TG8 in the resistor circuit 701 is controlled by the detection signal HT and the inverted signal/HT generated from the temperature detecting circuit 401.

Now, an operation of the pulse signal generating circuit in FIG. 7 will be described below.

At the normal temperature, the detection signal HT attains the low level, and the inverted signal/HT attains the high level. Thereby, the transfer gate TG8 in the resistor circuit 701 is turned on, and the transfer gate TG7 is turned off. Therefore, the resistor R3 is operatively connected between the nodes n71 and n72. Consequently, the signal transmission speed in the ring oscillator 700 decreases, and the period of the pulse signal φ supplied from the node n1 increases.

At the high temperature, the detection signal HT attains the high level, and the inverted signal/HT attains the low level. Thereby, the transfer gate TG7 in the resistor circuit 701 is turned on, and the transfer gate TG8 is turned off. Therefore, the node n71 is operatively connected to the node n72. Consequently, the signal transmission speed in the ring oscillator 700 increases, and the period of the pulse signal φ supplied from the node n1 decreases.

Therefore, the refresh period T3 in the refresh operation increases at the normal temperature, and the refresh period T3 in the refresh operation decreases at the high temperature.

According to the seventh embodiment, the refresh operation is reliably executed even at the high temperature, and the power consumption is reduced at the normal temperature.

(8) Eighth Embodiment

Figure 8:
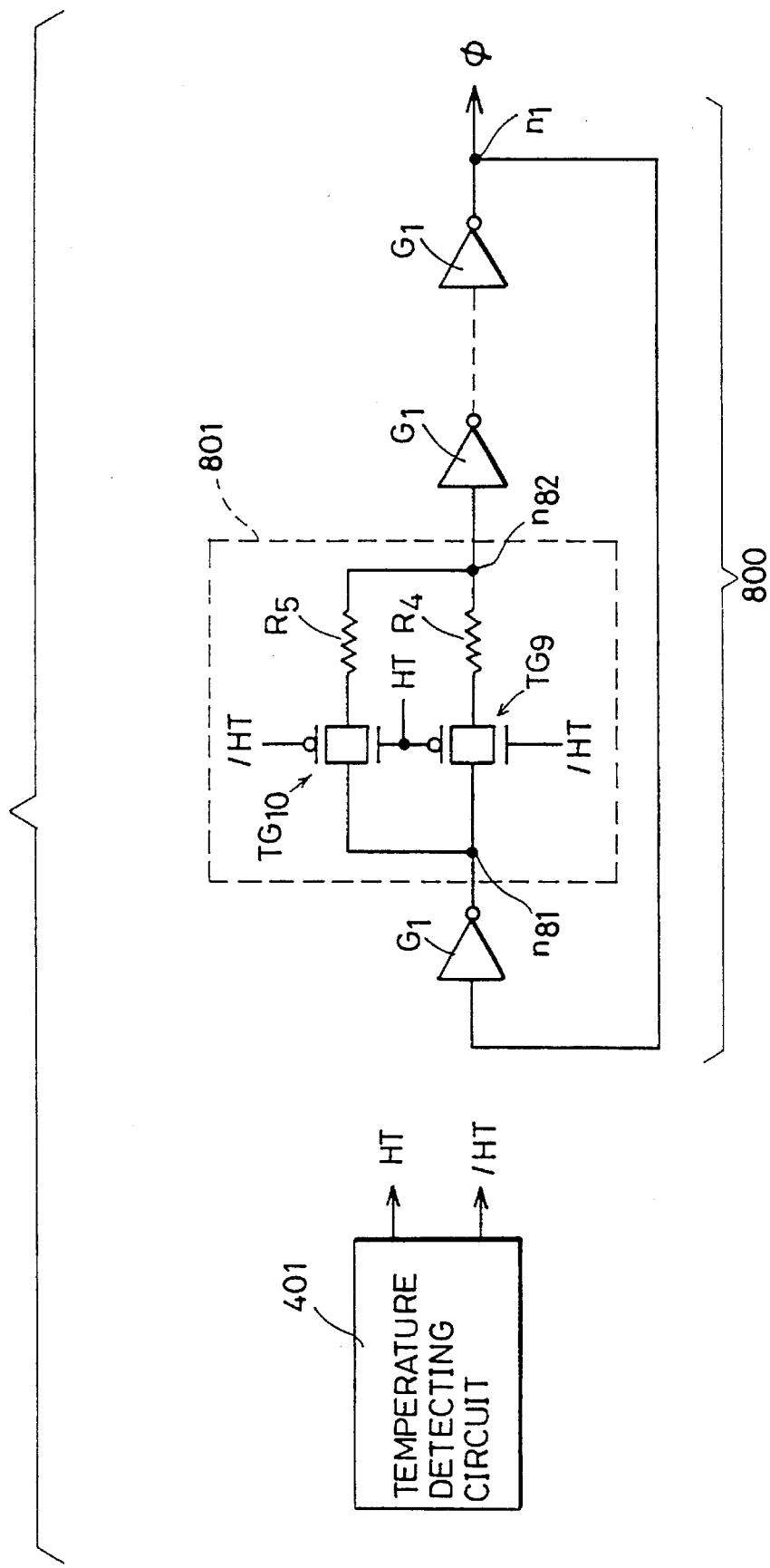
FIG. 8 is a circuit diagram showing a pulse signal generating circuit used in a DRAM of an eighth embodiment.

FIG. 8 is a circuit diagram showing a pulse signal generating circuit used in a DRAM of an eighth embodiment. The whole structure of the DRAM of the eighth embodiment is similar to that shown in FIG. 9.

The pulse signal generating circuit in FIG. 8 includes a ring oscillator 800 and a temperature detecting circuit 401.

The ring oscillator 800 includes a plurality of inverters G1 and a resistor circuit 801. The resistor circuit 801 is connected between two inverters G1. The resistor circuit 801 includes a resistor R4 having a large resistance, a resistor R5 having a small resistance and transfer gates TG9 and TG10. Between nodes n81 and n82, there are connected a serial circuit, which is formed of the transfer gate TG9 and resistor R4, and a serial circuit, which is formed of the transfer gate TG10 and resistor R5, in parallel to each other.

An operation of the temperature detecting circuit 401 is similar to that of the temperature detecting circuit 401 shown in FIG. 4. The transfer gates TG9 and TG10 in the resistor circuit 801 are controlled by the detection signal HT and the inverted signal/HT supplied from the temperature detecting circuit 401.

Now, an operation of the pulse signal generating circuit in FIG. 8 will be described below.

At the normal temperature, the detection signal HT attains the low level, and the inverted signal/HT attains the high level. Thereby, the transfer gate TG9 in the resistor circuit 801 is turned on, and the transfer gate TG10 is turned off. Therefore, the resistor R4 having the large resistance is operatively connected between the nodes n81 and n82. Consequently, the signal transmission speed in the ring oscillator 800 decreases, and the period of the pulse signal φ generated from the node n1 increases.

At the high temperature, the detection signal HT attains the high level, and the inverted signal/HT attains the low level. Thereby, the transfer gate TG10 in the resistor circuit 801 is turned on, and the transfer gate TG9 is turned off. Thereby, the resistor R5 having the small resistance is operatively connected between the nodes n81 and n82. Consequently, the signal transmission speed in the ring oscillator 800 increases, and the period of the pulse signal φ supplied from the node n1 decreases.

Therefore, the refresh period T3 in the refresh operation increases at the normal temperature, and the refresh period T3 in the refresh operation decreases at the high temperature.

According to the eighth embodiment, the refresh operation is reliably executed even at the high temperature, and the power consumption can be reduced at the normal temperature.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A pulse signal generating circuit comprising:

signal generating means for generating a pulse signal at a pulse period;

temperature detecting means for detecting an operation temperature and producing a detection signal therefrom; and control means for controlling the pulse period of the pulse signal, which is generated by said signal generating means in response to said detection signal supplied from said temperature detecting means, wherein said signal generating means includes a plurality of inverters, which are mutually connected in a ring form, said control means includes switch means for selectively forming a ring oscillator formed of said plurality of inverters, or formed of some of said plurality of inverters, in response to said detection signal supplied from said temperature detecting means, said temperature detecting means is operable to generate the detection signal at a first state when an operation temperature is higher than a predetermined temperature, and to generate the detection signal at a second state when the operation temperature is lower than a predetermined temperature, said switch means includes a first transfer gate which is connected after a first set of adjacent inverters at a first node and before a second set of adjacent inverters at a second node, and said first transfer gate being responsive to said detection signal at said first state to be turned on, and responsive to said detection signal at said second state to be turned off.

2. The pulse signal generating circuit according to claim 1, wherein said switch means further includes a second transfer gate, which is connected between said first node and one of the remaining inverters among said plurality of inverters, and a third transfer gate, which is connected between said second node and one of the remaining inverters among said plurality of inverters, said second and third transfer gates being responsive to said detection signal at said second state to be turned on and being responsive to said detection signal at said first state to be turned off.

3. A pulse signal generating circuit comprising:

signal generating means for generating a pulse signal at a pulse period;

temperature detecting means for detecting an operation temperature and producing a detection signal therefrom; and control means for controlling the pulse period of the pulse signal, which is generated by said signal generating means in response to said detection signal supplied from said temperature detecting means, wherein said signal generating means includes a plurality of inverters, which are mutually connected in a ring form, and said control means includes capacitance means and connecting means for connecting said capacitance means to a node located between adjacent two of said inverters in response to said detection signal supplied from said temperature detecting means.

4. The pulse signal generating circuit according to claim 3, wherein said temperature detecting means is operable to generate the detection signal at a first state when an operation temperature is higher than a predetermined temperature, and to generate the detection signal at a second state when the operation temperature is lower than a predetermined temperature, and said connecting means includes switch means which is connected between said capacitance means and said node, said switch means being responsive to said detection signal at the first state to be turned off and being responsive to said detection signal at the second state to be turned on.

5. A pulse signal generating circuit comprising:

signal generating means for generating a pulse signal at a pulse period;

temperature detecting means for detecting an operation temperature and producing a detection signal therefrom; and control means for controlling the pulse period of the pulse signal, which is generated by said signal generating means in response to said detection signal supplied from said temperature detecting means, wherein said signal generating means includes a plurality of inverters, which are mutually connected in a ring form, and said control means includes first capacitance means having a first capacitance value, second capacitance means having a second capacitance value smaller than said first capacitance value, and connecting means, which is responsive to said detection signal supplied from said temperature detecting means to selectively connect said first and second capacitance means to a node located between adjacent two of said inverters.

6. The pulse signal generating circuit according to claim 5, wherein said temperature detecting means is operable to generate the detection signal at a first state when an operation temperature is higher than a predetermined temperature, and to generate the detection signal at a second state when the operation temperature is lower than a predetermined temperature, and said connecting means includes first switch means, which is connected between said first capacitance means and said node and is responsive to said detection signal at the second state to be turned on, and second switch means, which is connected between said second capacitance means and said node and is responsive to said detection signal at the first state to be turned on.

7. A pulse signal generating circuit comprising:

signal generating means for generating a pulse signal at a pulse period;

temperature detecting means for detecting an operation temperature and producing a detection signal therefrom; and control means for controlling the pulse period of the pulse signal, which is generated by said signal generating means in response to said detection signal supplied from said temperature detecting means, wherein said signal generating means includes a plurality of inverters which are mutually connected in a ring form, and said control means includes resistance means, and connecting means which is responsive to said detection signal supplied from said temperature detecting means to connect said resistance means between adjacent two of said inverters.

8. The pulse signal generating circuit according to claim 7, wherein said temperature detecting means is operable to generate said detection signal at a first state when an operation temperature is higher than a predetermined temperature, and to generate said detection signal at a second state when said operation temperature is lower than said predetermined temperature, and said connecting means includes first and second transfer gates, said resistance means and said first transfer gate being connected in series between adjacent two of said inverters, said second transfer gate being connected in parallel to a series connection of said resistance means and said first transfer gate, said first transfer gate being responsive to said detection signal at said second state to be turned on, and said second transfer gate being responsive to said detection signal at the first state to be turned on.

9. A pulse signal generating circuit comprising:

signal generating means for generating a pulse signal at a pulse period;

temperature detecting means for detecting an operation temperature and producing a detection signal therefrom; and control means for controlling the pulse period of the pulse signal, which is generated by said signal generating means in response to said detection signal supplied from said temperature detecting means, wherein said signal generating means includes a plurality of inverters which are mutually connected in a ring form, and said control means includes first resistance means having a first resistance value, second resistance means having a second resistance value smaller than said first resistance value, and connecting means for selectively connecting said first and second resistance means between adjacent two of said inverters in response to said detecting signal supplied from said temperature detecting means.

10. The pulse signal generating circuit according to claim 9, wherein said connecting means includes first and second transfer gates, said first resistance means and said first transfer gate being connected in series between adjacent two of said inverters, said second resistance means and said second transfer gate being connected between adjacent two of said inverters in parallel to a series connection of said first resistance means and said first transfer gate, and said first transfer gate being responsive to said detection signal at the second state to be turned on, said second transfer gate being responsive to said detection at the first state to be turned on.

* * * * *